(12) United States Patent
Van Den Eijnden (10) Patent No.: US 12,025,651 B2
(45) Date of Patent: Jul. 2, 2024

(54) METHOD, ARRANGEMENT AND COMPUTER PROGRAM PRODUCT FOR DEBUGGING A PRINTED CIRCUIT BOARD

(71) Applicant: JTAG Technologies B.V., Eindhoven (NL)

(72) Inventor: Petrus Marinus Cornelis Maria Van Den Eijnden, Eindhoven (NL)

(73) Assignee: JTAG TECHNOLOGIES B.V., Eindhoven (NL)

( * ) Notice: Subject to any disclaimer, the term of this patent is extended or adjusted under 35 U.S.C. 154(b) by 0 days.

(21) Appl. No.: 17/772,490

(22) PCT Filed: Nov. 5, 2020

(86) PCT No.: PCT/NL2020/050687
§ 371 (c)(1),
(2) Date: Apr. 27, 2022

(87) PCT Pub. No.: WO2021/091376
PCT Pub. Date: May 14, 2021

(65) Prior Publication Data
US 2022/0404412 A1 Dec. 22, 2022

(30) Foreign Application Priority Data
Nov. 8, 2019 (NL) .................................... 2024200

(51) Int. Cl.
*G01R 31/28* (2006.01)
(52) U.S. Cl.
CPC ................. *G01R 31/2803* (2013.01)
(58) Field of Classification Search
CPC ............ G01R 31/319; G01R 31/31905; G01R 31/31912; G01R 31/3185;
(Continued)

(56) References Cited

U.S. PATENT DOCUMENTS 6,353,905 B1 * 3/2002 Noguchi ........ G01R 31/318544
714/728
6,988,229 B1   1/2006 Folea, Jr.
(Continued)

FOREIGN PATENT DOCUMENTS

EP    2320241 A1   5/2011
JP    2005214957   8/2005

OTHER PUBLICATIONS

International Search Report issued for International PCT Application No. PCT/NL2020/050687 filed on Nov. 5, 2020, on behalf of JTAG Technologies B.V. Mail Date: Dec. 14, 2020. 5 Pages.
(Continued)

*Primary Examiner* — Thang X Le
(74) *Attorney, Agent, or Firm* — Steinfl + Bruno LLP (57) ABSTRACT

A method of debugging a printed circuit board with at least one boundary-scan compliant device is presented. The method uses an electronic processing unit and includes the steps of: retrieving boundary-scan properties of the at least one boundary-scan compliant device, the properties including a listing of boundary-scan compliant circuit terminals of the at least one boundary-scan compliant device; retrieving connectivity properties; selecting and displaying a circuit graph of at least a part of the devices mounted on the printed circuit board, the circuit graph including at least one of the devices mounted on the printed circuit board and a least one further device from the devices which has a circuit terminal interconnected to a circuit terminal of the device for visualizing at least the device, the further device and interconnects between the circuit terminals of the devices.

14 Claims, 3 Drawing Sheets

(58) Field of Classification Search
CPC ...... G01R 31/318591; G01R 31/31855; G01R 31/318538; G01R 31/31701; G01R 31/31705
See application file for complete search history.

(56) References Cited

U.S. PATENT DOCUMENTS

| | | |
|---|---|---|
| 10,816,598 B1 * | 10/2020 | Merugu ............. G01R 31/3177 |
| 2002/0138801 A1 * | 9/2002 | Wang ............... G01R 31/31705 714/729 |
| 2009/0105983 A1 | 4/2009 | Variyam et al. |
| 2011/0113298 A1 * | 5/2011 | Van Den Eijnden ........................ G01R 31/31855 714/E11.155 |
| 2014/0123096 A1 | 5/2014 | Su et al. |
| 2020/0301796 A1 * | 9/2020 | Hu ...................... G06F 13/4282 |

OTHER PUBLICATIONS

Written Opinion issued for International PCT Application No. PCT/NL2020/050687 filed on Nov. 5, 2020, on behalf of JTAG Technologies B.V. Mail Date: Dec. 14, 2020. 7 Pages.

\* cited by examiner

METHOD, ARRANGEMENT AND COMPUTER PROGRAM PRODUCT FOR DEBUGGING A PRINTED CIRCUIT BOARD

CROSS REFERENCE TO RELATED APPLICATIONS

The present application is the US National Stage of International Patent Application No. PCT/NL2020/050687, filed on Nov. 5, 2020, which in turn, claims priority to Dutch Patent Application No. 2024200, filed on Nov. 8, 2019.

TECHNICAL FIELD

The present disclosure relates in general to debugging one or more printed circuit boards.

The present disclosure further relates to an arrangement for, and a debugging arrangement as well as a computer program product for testing printed circuit boards.

BACKGROUND

Printed circuit boards may comprise a large number of electronic components, these components are attached to the printed circuit board for example through contact pads. Conductive tracks connect the components through their conductive pads.

Modern printed circuit boards have multi-layer prints with trace layers or conductive tracks in between the layers. As such, only the tracks on the top and bottom layer of the printed circuit board are visible. Since modern printed circuit boards may comprise between four and eight layers (although many more layers may also be common), most of the tracks are invisible. Testing and debugging such printed circuit boards is thus challenging since many of the pins of the components are difficult to distinguish by the debugger since they are invisible. Many components and tracks are also very small which further complicates testing and debugging.

Failures by one of the components or one of the tracks may already cause the complete printed circuit board to malfunction. It is therefore desirable that each component and every track can be monitored and tested to ensure correct functioning.

To this end, in the design phase of the printed circuit board, boundary-scan functionality may be implemented in the board. With boundary-scan an electronic serial interface is provided which allows access to embedded logic on many of today's electrical components, e.g. integrated circuits. With the boundary-scan components, several functionalities are added to the boards such as, logic testing, for example testing of connections between devices without external test probes, programming logic, for example for programming FPGA's, and for debugging logic in integrated circuits and microcontrollers.

Many of today's printed circuit boards are equipped with boundary-scan devices. These printed circuit boards can be tested by running a boundary-scan test (BST). Boundary Scan Test (BST) is a method developed to assist the testing of Printed Circuit Boards and is laid down in a standard (IEEE Std. 1149.1—1990).

In order to detect faults of the PCB, test patterns or test vectors have to be developed, preferably test vectors or test patterns which cover all faults and yet make a diagnosis as simple as possible. Use of such test vectors in a boundary-scan test is very beneficial for testing the several functional aspects of the printed circuit board and individual components and tracks thereof, and is also adequate for inspecting which components are connected with each other.

Boundary-scan provides a tool in all stages of the PCB. Meaning, that during the design stage, boundary-scan provides the designer of the PCB with a tools for ad-hoc debugging of certain aspects of the PCB, even before the PCB has been released for production. If the design is final, and corresponding test vectors have been developed, the assembled boards may be tested for faults during the production test stage. Later, similarity in the service stage boundary-scan provides a tool for ad-hoc debugging.

In all stages of the PCB, the designer, tester and service engineer may run (ad-hoc) boundary-scan tests to determine if output of the test is as expected. Given thorough designs and manufacturing, most output will be as expected and tests will pass. However, as with all design and manufacturing, sometimes the outcome isn't as expected. In such cases, the designer and/or tester will have to debug and dive into the details of the test to determine where the error is. This can be very challenging.

It is an object of the present invention to provide a simplified and efficient method for debugging a printed circuit board as well as test-patters for printed circuit boards, with one or more boundary-scan compliant devices.

The object is achieved in a first aspect of the present disclosure, by a method of debugging a printed circuit board, and/or at least one test-pattern for such printed circuit board, said printed circuit board comprising a plurality of devices mounted on said printed circuit board having circuit terminals for interconnecting said devices, said devices comprising at least one boundary-scan compliant device having boundary-scan compliant circuit terminals and comprising a boundary-scan register of boundary-scan cells of said boundary-scan compliant circuit terminals, said method using an electronic processing unit and comprising the steps of:

retrieving, by said processing unit, boundary-scan properties of said at least one boundary-scan compliant device, said boundary-scan properties at least comprising a listing of boundary-scan compliant circuit terminals of said at least one boundary-scan compliant device;

retrieving, by said processing unit, connectivity properties of said plurality of devices mounted on said printed circuit board, said connectivity properties at least comprising a listing of interconnects between said circuit terminals of said devices;

displaying, by said processing unit, a circuit graph of at least a part of said devices mounted on said printed circuit board, said circuit graph comprising at least one device of said plurality of devices mounted on said printed circuit board and a least one further device from said plurality of devices which comprises a circuit terminal interconnected to a circuit terminal of said device for visualizing at least said device, said further device and interconnects between said devices for debugging said printed circuit board; wherein said device is determined by receiving, by said processing unit, a selection from one of the group of: said printed circuit board, said devices mounted on said printed circuit board, and a circuit terminal of one of said devices mounted on said printed circuit board.

With boundary-scan a low-cost tool is provided to verify the correctness of the components on a PCB as well as the interconnects between these components. It allows both certain functional aspects as well as structural testing of the components and the nets within the PCB, for components and interconnects which are located on the surface of the board, but even for those in intermediate layers of a multi-layer PCB.

With boundary-scan designers, testers and service engineers are given tools for debugging certain aspects of the PCB. In the design stage it may for example help designers to select boundary-scan compliant devices such that the testing of the PCB can be done in a more efficient manner, i.e. with aid of boundary-scan tests. In the testing stage, the tester may perform a predefined boundary-scan test or test vector to determine if all components and interconnects operate as expected according to the tests.

If a boundary-scan test fails, meaning components and/or interconnects under test indicate fails or the output data of a test is not as expected, debugging may be required for further examination and determine where the error is.

Often, the tester or designer may receive or determine from the output of the boundary-scan test at least some details where the error occurred. For example, the test fails at a certain component or blocks of components on the PCB. The debugger then wants to further investigate the components in or near that block, which is difficult to determine due to the miniaturized components and (hidden)interconnects.

Currently, the debugger may employ conventional debugging techniques such as probe testing and inspecting design details of the PCB, i.e. a circuit layout, list of components, position of the components and netlist. A debugger however, not always has access to or has such information at their disposal.

With the presented method according to the first aspect of the disclosure, a processing unit such as a boundary-scan test device or general-purpose computer, will obtain the properties of boundary-scan compliant devices on the printed circuit board. The processing unit also obtains a listing of the interconnects between the devices on the PCB. Once this data is obtained, the processing unit knows the components and the interconnects and will obtain from the user, through a graphic user interface, a selection of the components and/or interconnects to provide visual representation thereof through the graphical user interface.

Thus at the development stage of the PCB the PCB designer may develop a boundary-scan test and determine that the outcome of the test is incorrect, e.g. components to not respond or respond different from what is expected, or he or she may discover that such a test cannot be executed or a smaller part than expected can be executed, due to certain aspects of the design. In such a case, the designer may start debugging to determine if components of the PCB interact with other components where the test fails or where the outcome of the test outcome is not as expected. This need not only arises during unexpected outcome of a test in the design stage but also during a failed test at the testing stage in which the PCB has already been assembled, but testing of the PCB points out that components or sub-blocks of components or interconnects are malfunctioning.

It was an insight of the inventor that for debugging of the PCB and/or debugging during development of the test-vectors for the PCB, and possibly also in other stages of the, there is a need for visualizing (part of) the circuit layout. This aids the debugger to obtain information required to solve the issue and re-run the test until its outcome is as expected. To this end, with the method according to the first aspect, the processing unit will generate and display, through a graphic user interface, a list of all components and the pins thereof. The user may select one of the pins of one of the components and based on that selection and the obtained boundary-scan properties of the boundary-scan compliant devices and the listing of interconnects, enable the processing unit to determine which further components in the circuit graph of the component of which the pin is selected, are connected thereto. The circuit graph with these components, hence the component having the selected pin, as well as any other component of the same circuit graph, is then shown to user through the graphical user interface such that the user is provided a simple and straightforward method for debugging.

In an example, said device is determined by receiving, by said processing unit, a selection of at least one printed circuit board.

In an example, said device is determined by receiving, by said processing unit, a selection of at least one device mounted on a printed circuit board of said selection of said at least one printed circuit board.

In an example, said device is determined by receiving, by said processing unit, a selection of a circuit terminal of one of said devices mounted on said printed circuit board.

The visualization method according to the first aspect for debugging a PCB is able to visualize the full or part of a circuit graph of a selection of the user through the graphical user interface. The selection may contain the PCB as a whole, which results in the visualization of plural circuit graphs with all components. The selection may also contain a single device which results in the visualization of the circuit graph with all components in that graph. And finally, the selection may also be a single pin or circuit terminal of a device such that the device or devices connected thereto and thus in that circuit graph are visualized.

In an example, said step of displaying, by said processing unit, comprises displaying a circuit graph of at least part of said devices, and wherein for each of said displayed devices properties are displayed corresponding to said device.

In an example, said properties comprise one or more of the group consisting of: number of circuit terminals, number of boundary-scan compliant circuit terminals, type of device, consecutive number identification of said type of device and interconnected circuit terminal.

In addition to visualization of the device, the information shown may also contain further information such as the number of pins or contact pads of that device, or information from which the user may observe which component it is, e.g. a resistor, microcontroller, etc.

In an example, said method further comprises: determining boundary-scan transparent devices from said listing of boundary scan properties and said connectivity properties, wherein said transparent devices are defined by devices through which data of a boundary-scan test is passed through said device in a non-adjusted manner.

The devices or components on the PCB may, for the purpose of boundary-scan be considered a transparent device. An example of such a transparent device is a resistor which, under certain circumstances, be considered a track for being a passive/non-active component. In this case, the circuit graph of which this transparent device forms part of, will contain components or devices on both pins of the transparent device. Thus, the circuit graph shown will visualize the graphs of both pins. In case of multiple transparent devices, more than two circuit graphs may be combined into one single graph, e.g. combining two, three or even more graphs into a single graph for display to the user.

Preferably, the user or debugger (developer, tester or service engineer), is able to select, or modify which of the components are transparent and thus will have visualized combined circuit graphs. If many of these transparent components are connected to each other, the visualized circuit graph may become too large for simple and straightforward presentation thereof through the graphical user interface. To this end, the method preferably comprises a step wherein input is obtained from the user of a maximum number of components in circuit graph.

In an example, said method further comprises: subjecting, by said processing unit, at least one boundary-scan compliant circuit terminal of a chain boundary-scan compliant circuit terminals of said boundary-scan compliant devices mounted on said printed circuit board to a boundary-scan test.

In an example, said boundary-scan test is operated for generating said connectivity properties of said devices mounted on said printed circuit board.

In an example, said boundary scan properties are retrieved from a Boundary Scan Description Language, BSDL, file of said at least one boundary-scan compliant device.

In an example, the method further comprises a graphical interface device, wherein at least one of said steps of displaying, receiving, operating and presenting are controlled from said graphical interface device.

In a second aspect of the present disclosure, a debugging arrangement is provided for debugging a printed circuit board, and/or at least one test-pattern for such printed circuit board, said printed circuit board comprising a plurality of devices mounted on said printed circuit board having circuit terminals for interconnecting said devices, said devices comprising at least one boundary-scan compliant device having boundary-scan compliant circuit terminals and comprising a boundary-scan register of boundary-scan cells of said boundary-scan compliant circuit terminals, said debugging arrangement comprising an electronic processing arranged for:
- retrieving boundary-scan properties of said at least one boundary-scan compliant device, said boundary-scan properties at least comprising a listing of boundary-scan compliant circuit terminals of said at least one boundary-scan compliant device;
- retrieving connectivity properties of said plurality of devices mounted on said printed circuit board, said connectivity properties at least comprising a listing of interconnects between said circuit terminals of said devices;
- displaying a circuit graph of at least a part of said devices mounted on said printed circuit board, said circuit graph comprising at least one device of said plurality of devices mounted on said printed circuit board and a least one further device from said plurality of devices which comprises a circuit terminal interconnected to a circuit terminal of said device for visualizing at least said device, said further device and interconnects between said devices for debugging said printed circuit board; wherein said device is determined by receiving, by said processing unit, a selection from one of the group of: said printed circuit board, said devices mounted on said printed circuit board, and a circuit terminal of one of said devices mounted on said printed circuit board.

In a third aspect of the present disclosure, a computer program product is provided comprising a data storage device storing thereon computer program code data arranged for performing the method of any of the above aspect and examples, when said program code data are loaded into a memory of an electronic processing unit and are executed by said electronic processing unit.

These and other objects, advantages, and features of the invention will be readily understood and appreciated by reference to the detailed description of the current embodiment and the drawings.

DETAILED DESCRIPTION

Figure 1:
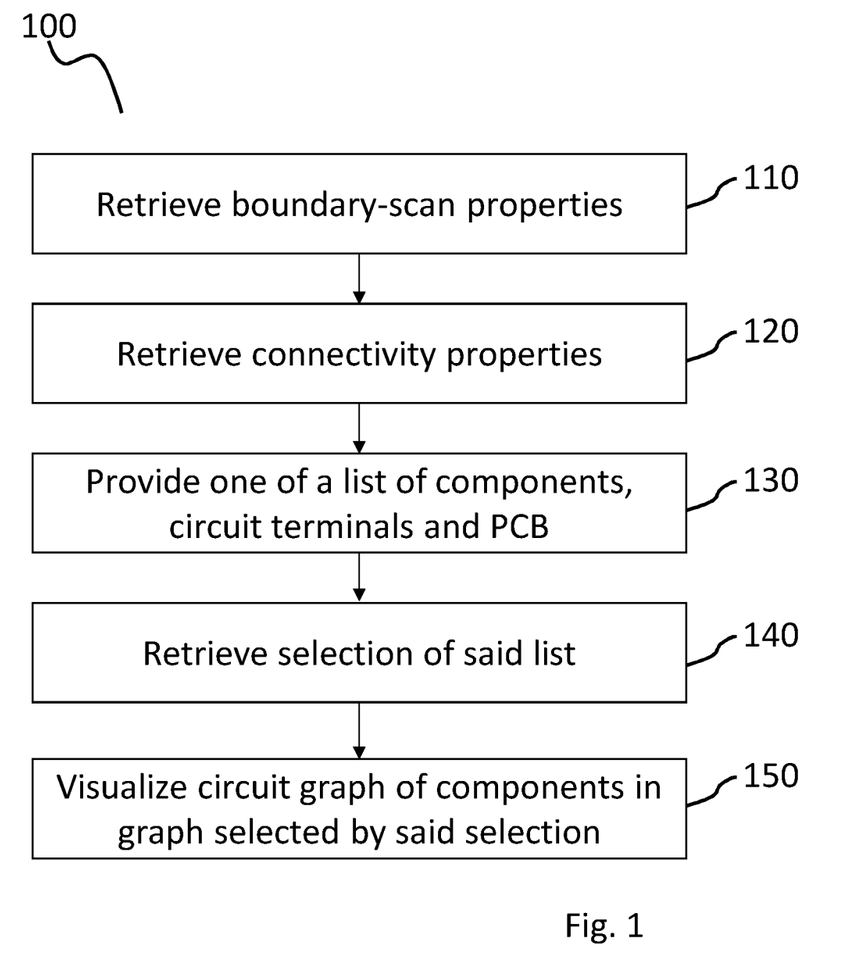
FIG. 1 shows, in a flowchart manner, the steps of the method according to an aspect of the present disclosure.

FIG. 1 shows a flowchart 100 of steps of a method for debugging a Printed Circuit Board, PCB. Debugging is to be interpreted in a broad sense, meaning that debugging may be performed in several stages of the design, manufacturing, testing and performing measurements on the PCB. During the design stage, the PCB designer is defining which components (e.g. which types of devices from which supplier), should be located on which physical positions on the PCB. Computers may aid the designer in making such decisions. Preferably, the designer selects, where possible, boundary-scan compliant devices such that the device or component, or more preferably sub-blocks of components or even more preferably, the whole PCB or even the complete system of several PCB's, are arranged to perform boundary-scan tests on.

To this end, the PCB is provided with at least one boundary-scan compliant device which has at least one but mostly two or more circuit terminals or contact pads to power and/or connect the electronic component with the power supply and other components on the PCB through interconnects or tracks.

To provide the boundary-scan capability, the boundary-scan compliant devices are equipped with additional logic to include scan cells for each of the circuit terminals. The cells are connected to each other to form a chain of boundary-scan cells or boundary-scan scan shift register. The boundary-scan compliant device is further equipped with a test access port as an interface for the register and to provide control circuitry such as a clock signal, reset, etc. The boundary-scan cells which form the boundary-scan register are arranged to shift data from the test data input, through the different boundary-scan cells, to the test data output. The test access port controls each of the different boundary-scan cells for example to operate as a driver for outputting a logic signal to the corresponding boundary-scan circuit terminal. The cells may also be controlled to operate as a sensor for capturing logic signals at that circuit terminal.

Several boundary-scan compliant devices together can be interconnected in series. This can be done, by connecting the test data output of a boundary-scan compliant device with the test data input of a further boundary-scan compliant device. In this way, a boundary-scan chain is formed which is controllable from the control interface or the boundary-scan controller, e.g. through an electronic processing unit or interface with a general-purpose computer.

The boundary-scan method of the present disclosure, as indicated in FIG. 1 is arranged for debugging a PCB. The PCB comprises several components, of which at least one or several are boundary-scan compliant devices which are mounted on the PCB and having circuit terminals for interconnecting the devices. The circuit terminals are boundary-scan compliant circuit terminals meaning that they comprising a boundary-scan register of boundary-scan cells. The method comprises several steps to enable simplified and efficient debugging capabilities to the PCB designer, tester or other user working with the PCB.

In the first step 110 the processing unit retrieves boundary-scan properties of those devices on the PCB which are boundary-scan compliant. These properties may be retrieved from a Boundary Scan Description Language, BSDL, file of a boundary-scan compliant device mounted at the PCB. The information of the BSDL files is also used in the Graphical User Interface, GUI, as shown on FIG. 2.

In the next step 120, which may be performed after, prior to or in parallel with step 110, the processing unit retrieves connectivity properties of the plurality of devices mounted on said printed circuit board. The connectivity properties at least comprise a listing of interconnects between said circuit terminals of said devices. These interconnect properties or track data may be retrieved from a so called net list which describe all nets or circuits on the PCB and thus which pins or circuit terminals of which device or component are connected with each other.

Once the device and interconnect properties are retrieved, the processing unit may display information to the user (debugger) through the GUI. What is displayed is a list of the components, the circuit terminals of these components as well as the net lists. Hence, the user may be presented 130 a list of all circuit terminals (of all components), all components, all net, or the PCB as a whole. The user may then select, through the GUI, one from the list.

The processing unit receives 140 the selection of the list from the user to visualize the circuit graph 150 with components comprised in the graph of which one of the components is the component selected, or comprises a selected circuit terminal, or alternatively, all circuit graphs are visualized which form part of the PCB which is selected in step 130.

Figure 2:
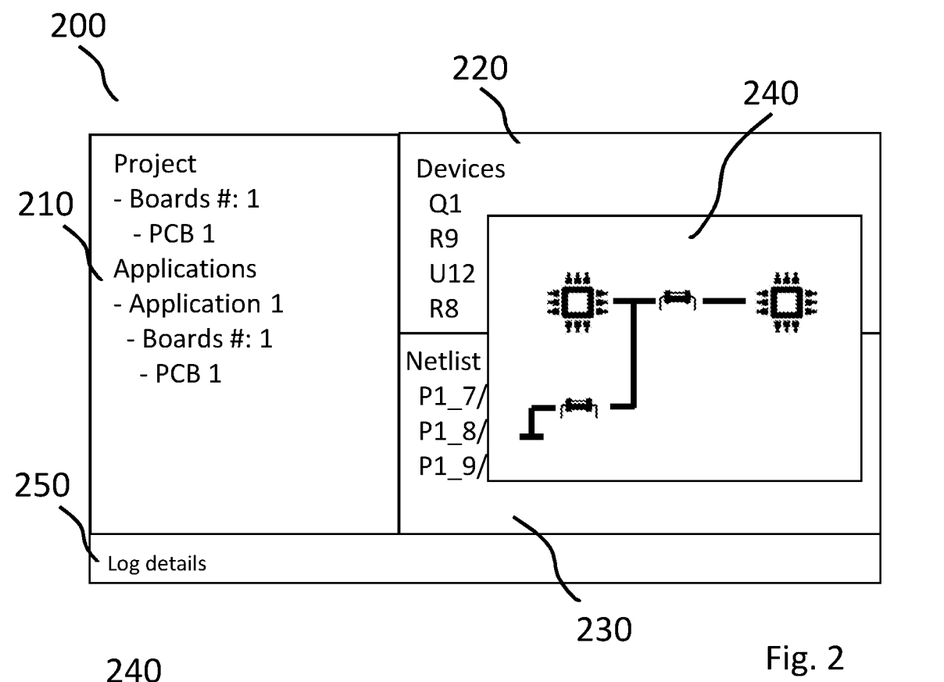
FIG. 2 shows, in an illustrative manner, a graphical user interface for performing the method according to an aspect of the present disclosure.

In FIG. 2 a GUI 200 is shown of an example of a boundary-scan application for developing and/or testing boundary-scan tests. Through the GUI 200 the user may be able to control the processing unit to retrieve the boundary-scan properties of the boundary-scan compliant devices and to retrieve connectivity properties. The GUI 200 may be arranged to import circuit diagrams from plural sources for extracting the boundary-scan properties of the boundary-scan compliant devices as well as the connectivity properties.

The GUI 200 shown in FIG. 2 comprises several sections, 210, 220, 230, 240 and 250. In the first section 210, the project details may be shown which comprise for example information of the number of boards and details of the boards (PCBs). By selecting one of the boards, the details of the devices on the boards are shown in section 220. These comprise the boundary-scan properties of the boundary-scan compliant devices, as for example shown in FIG. 2 by devices Q1, R9, U12 and R8. Below the device properties, is a section 230 for net properties which indicate which nets exist on the board. At the bottom a separate log 250 section provided for showing al details or logs of the selections and steps in running the application.

Figure 3:
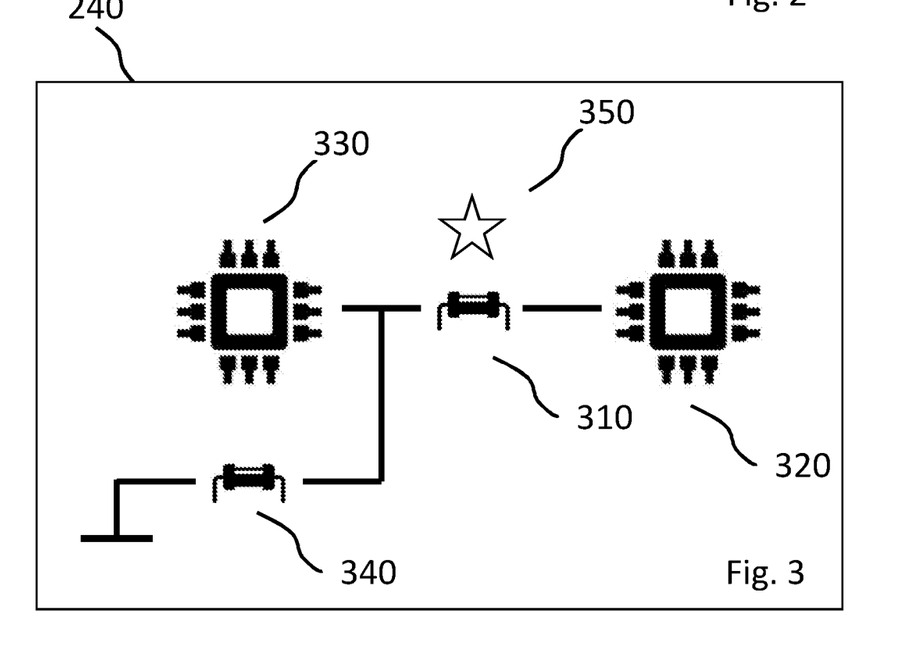
FIG. 3 shows, in an illustrative manner, a circuit graph presentation in a graphical user interface according to an aspect of the present disclosure.
Figure 4:
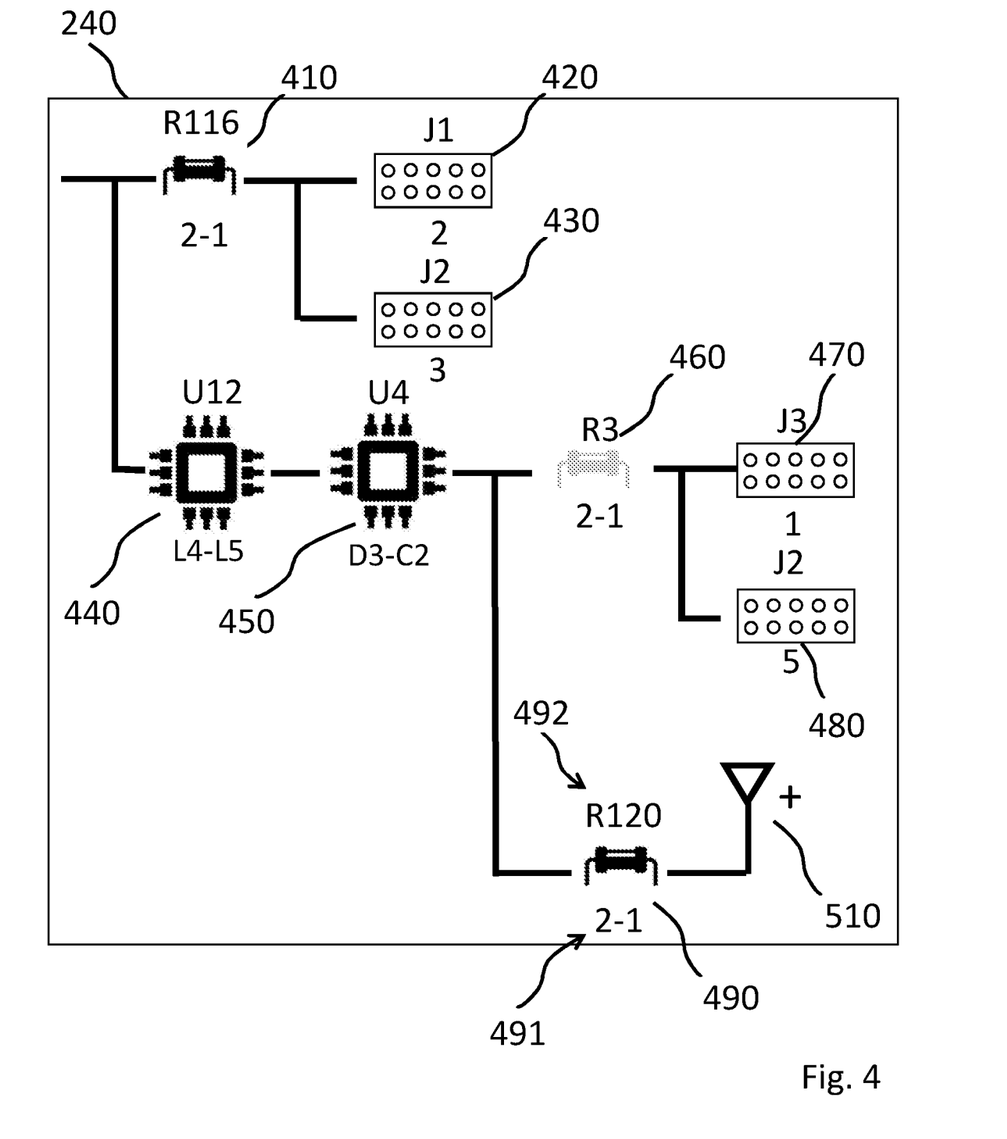
FIG. 4 shows, in an illustrative manner, another circuit graph presentation in a graphical user interface according to an aspect of the present disclosure.

After having selected the PCB, device or component, circuit terminal or net, the corresponding circuit graph is presented in a separate circuit graph explorer 240 which is preferably an overlay over the sections 210 220, and 230. In FIGS. 3 and 4 a more detailed view is presented of the circuit graph explorer 240.

In FIG. 3 the circuit graph explorer 240 is shown with 4 devices, i.e. two integrated circuits 320, 330 and two resistors 310, 340. The icon 350 close to the resistor 350 indicates the selection of the list, i.e. in this case a device. In between the devices the interconnects are shown as well to indicate how each of the devices in the circuit is connected.

Since some circuit graphs may comprise a large number of components, the maximum number of components is preferably configurable. Preferably, the components visualized are arranged in an array of rows and columns which allow the user to configure a maximum number of components per column and per row to increase legibility of the circuit graph.

In FIG. 4 a more elaborate example of the circuit graph 240 is shown with a large number of devices. As shown the devices 410, 420, 430, 440, 450, 460, 470, 480, 490, 510 comprise additional information indicating the type of device, e.g. a resistor 410, 460, 490, and sequence number of the type of device 492. Moreover, the circuit terminal identification is preferably also shown 491 to indicate which pins or circuit terminals connect with which device.

As shown in FIG. 4, resistor R3, 460 is partially transparent which indicates the device is considered a boundary-scan transparent device or is configured as such.

Other variations to the disclosed examples can be understood and effected by those skilled in the art in practicing the claimed disclosure, from a study of the drawings, the disclosure and the appended claims. In the claims, the word "comprising" does not exclude other elements or steps and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as optical storage medium or a solid-state medium supplied together with or as part of other hardware, but may also be distributed in other forms, such as via the internet or other wired or wireless telecommunication systems. Any reference signs in the claims should not construed as limiting scope thereof. Similar reference signs denote similar or equivalent functionality.

The present disclosure is not limited to the examples as disclosed above, and can be modified and enhanced by those skilled in the art beyond the scope of the present disclosure as disclosed in the appended claims without having to apply inventive skills and for use in any data communication, data exchange and data processing environment.

The invention claimed is:

1. A method for debugging a printed circuit board, and/or at least one test-pattern for such printed circuit board, said printed circuit board comprising a plurality of devices mounted on said printed circuit board having circuit terminals for interconnecting said devices, said devices comprising at least one boundary-scan compliant device having boundary-scan compliant circuit terminals and comprising a boundary-scan register of boundary-scan cells of said boundary-scan compliant circuit terminals, said method using an electronic processing unit and comprising the steps of:

retrieving, by said processing unit, boundary-scan properties of said at least one boundary-scan compliant device, said boundary-scan properties at least comprising a listing of boundary-scan compliant circuit terminals of said at least one boundary-scan compliant device;

retrieving, by said processing unit, connectivity properties of said plurality of devices mounted on said printed circuit board, said connectivity properties at least comprising a listing of interconnects between said circuit terminals of said devices;

displaying, by said processing unit, a circuit graph of at least a part of said devices mounted on said printed circuit board, said circuit graph comprising at least one device of said plurality of devices mounted on said printed circuit board and a least one further device from said plurality of devices which comprises a circuit terminal interconnected to a circuit terminal of said device for visualizing at least said device, said further device and interconnects between said devices for debugging said printed circuit board; wherein said device is determined by receiving, by said processing unit, a selection from one of the group of: said printed circuit board, said devices mounted on said printed circuit board, and a circuit terminal of one of said devices mounted on said printed circuit board.

2. The method of claim 1, wherein said device is determined by receiving, by said processing unit, a selection of at least one printed circuit board.

3. The method of claim 1, wherein said device is determined by receiving, by said processing unit, a selection of at least one device mounted on a printed circuit board of said selection of said at least one printed circuit board.

4. The method of claim 1, wherein said device is determined by receiving, by said processing unit, a selection of a circuit terminal of one of said devices mounted on said printed circuit board.

5. The method of claim 1, wherein said step of displaying, by said processing unit, comprises displaying a circuit graph of at least part of said devices, and wherein for each of said displayed devices properties are displayed corresponding to said device.

6. The method of claim 5, wherein said properties comprise one or more of the group consisting of: number of circuit terminals, number of boundary-scan compliant circuit terminals, type of device, consecutive number identification of said type of device and interconnected circuit terminal.

7. The method of claim 1, wherein said method further comprises: determining boundary-scan transparent devices from said listing of boundary scan properties and said connectivity properties, wherein said transparent devices are defined by devices through which data of a boundary-scan test is passed through said device in a non-adjusted manner.

8. The method of claim 1, wherein said method further comprises: subjecting, by said processing unit, at least one boundary-scan compliant circuit terminal of a chain boundary-scan compliant circuit terminals of said boundary-scan compliant devices mounted on said printed circuit board to a boundary-scan test.

9. The method of claim 8, wherein said boundary-scan test is operated for generating said connectivity properties of said devices mounted on said printed circuit board.

10. The method of claim 1, wherein said boundary scan properties are retrieved from a Boundary Scan Description Language, BSDL, file of said at least one boundary-scan compliant device.

11. The method of claim 1, further comprising a graphical interface device, wherein at least one of said steps of displaying, receiving, operating and presenting are controlled from said graphical interface device.

12. A non-transitional computer program product comprising a data storage device storing thereon computer program code data arranged for performing the method of claim 1, when said program code data are loaded into a memory of said electronic processing unit and are executed by said electronic processing unit.

13. A debugging arrangement for debugging a printed circuit board, and/or at least one test-pattern for such printed circuit board, said printed circuit board comprising a plurality of devices mounted on said printed circuit board having circuit terminals for interconnecting said devices, said devices comprising at least one boundary-scan compliant device having boundary-scan compliant circuit terminals and comprising a boundary-scan register of boundary-scan cells of said boundary-scan compliant circuit terminals, said debugging arrangement comprising an electronic processing unit configured for:

retrieving boundary-scan properties of said at least one boundary-scan compliant device, said boundary-scan properties at least comprising a listing of boundary-scan compliant circuit terminals of said at least one boundary-scan compliant device;

retrieving connectivity properties of said plurality of devices mounted on said printed circuit board, said connectivity properties at least comprising a listing of interconnects between said circuit terminals of said devices;

displaying a circuit graph of at least a part of said devices mounted on said printed circuit board, said circuit graph comprising at least one device of said plurality of devices mounted on said printed circuit board and a least one further device from said plurality of devices which comprises a circuit terminal interconnected to a circuit terminal of said device for visualizing at least said device, said further device and interconnects between said devices for debugging said printed circuit board; wherein said device is determined by receiving, by a processing unit, a selection from one of the group of: said printed circuit board, said devices mounted on said printed circuit board, and a circuit terminal of one of said devices mounted on said printed circuit board.

14. A method for debugging a printed circuit board, and/or at least one test-pattern for such printed circuit board, said printed circuit board comprising a plurality of devices mounted on said printed circuit board having circuit terminals for interconnecting said devices, said devices comprising at least one boundary-scan compliant device having boundary-scan compliant circuit terminals and comprising a boundary-scan register of boundary-scan cells of said boundary-scan compliant circuit terminals, said method using an electronic processing unit and comprising the steps of:

retrieving, by said processing unit, boundary-scan properties of said at least one boundary-scan compliant device, said boundary-scan properties at least comprising a listing of boundary-scan compliant circuit terminals of said at least one boundary-scan compliant device;

retrieving, by said processing unit, connectivity properties of said plurality of devices mounted on said printed circuit board, said connectivity properties at least comprising a listing of interconnects between said circuit terminals of said devices;

identifying, by user input, at least one device of said plurality of devices by receiving a selection from one of the group of: said printed circuit board, said devices mounted on said printed circuit board, and a circuit terminal of one of said devices mounted on said printed circuit board; and displaying, by said processing unit, a circuit layout visualization comprising the at least one device of said plurality of devices with a first circuit terminal and a least one further device from said plurality of devices with a second circuit terminal interconnected to the first circuit terminal, the circuit layout visualization for debugging said printed circuit board.

* * * * *